United States Patent
Dietz et al.

(10) Patent No.: US 7,924,005 B2
(45) Date of Patent: Apr. 12, 2011

(54) ARRANGEMENT TO CONNECT GRADIENT CURRENT FEED LINES IN A MAGNETIC RESONANCE APPARATUS

(75) Inventors: Peter Dietz, Fuorth (DE); Johann Schuster, Oberasbach (DE); Stefan Stocker, Grosseruseebach (DE)

(73) Assignee: Siemens Aktiengesellschaft, Munich (DE)

( * ) Notice: Subject to any disclaimer, the term of this patent is extended or adjusted under 35 U.S.C. 154(b) by 146 days.

(21) Appl. No.: 12/428,854

(22) Filed: Apr. 23, 2009

(65) Prior Publication Data
US 2009/0267605 A1 Oct. 29, 2009

(30) Foreign Application Priority Data
Apr. 29, 2008 (DE) .......................... 10 2008 021 358

(51) Int. Cl.
*G01V 3/00* (2006.01)
(52) U.S. Cl. ........................ 324/307; 324/309
(58) Field of Classification Search .......... 324/300–322; 600/407–445
See application file for complete search history.

(56) References Cited

U.S. PATENT DOCUMENTS

| 4,862,085 | A  | * | 8/1989  | Aubert et al. ................. 324/315 |
| 6,954,068 | B1 |   | 10/2005 | Takamori et al. |
| 7,439,736 | B2 | * | 10/2008 | Meaney et al. ............... 324/307 |
| 7,495,444 | B2 | * | 2/2009  | Schuster et al. .............. 324/318 |
| 2009/0036766 | A1 | * | 2/2009 | Meaney et al. ............... 600/410 |

* cited by examiner

*Primary Examiner* — Brij B Shrivastav
(74) *Attorney, Agent, or Firm* — Schiff Hardin LLP

(57) ABSTRACT

An arrangement for connection of gradient current feed lines in a magnetic resonance apparatus has an electrically insulating connection plate with at least one connection device. The connection device is fashioned to electrically connect a first gradient current feed line with a second gradient current feed line and is associated with a gradient coil that forms a gradient field via a supplied gradient current for a spatial direction. The supply ensues via the two gradient current feed lines connected with one another. A base plate that is fashioned for fastening the connection plate to a magnet housing of the magnetic resonance apparatus. An electrically insulating layer to damp vibrations of the connection plate is arranged between the base plate and the connection plate.

8 Claims, 2 Drawing Sheets

Section A-A

ARRANGEMENT TO CONNECT GRADIENT CURRENT FEED LINES IN A MAGNETIC RESONANCE APPARATUS

BACKGROUND OF THE INVENTION

1. Field of the Invention

The present invention concerns an arrangement to connect gradient current feed lines in a magnetic resonance apparatus.

2. Description of the Prior Art

In magnetic resonance apparatuses, gradient current feed lines for three gradient coils (one each for x-, y- and z-spatial directions) are run from the RF compartment to the examination space. The examination space is surrounded by the gradient coils.

These gradient coil feed lines typically have a cross-section of 95 $mm^2$ in order to transmit the gradient coil current with little self-heating, and are at least partially run in the ceiling.

At the magnet housing of the magnetic resonance apparatus, the gradient currents are exposed to scatter fields of the basic magnet such that Lorentz forces act on the gradient current feed lines and the gradient coils are caused to oscillate.

For service reasons an interface at the magnet housing is provided for the gradient current feed lines. At this interface the gradient current feed lines that originate from the RF booth and are directed across the ceiling are connected with the gradient current feed lines of the gradient coils themselves.

The gradient current feed lines between this interface and the actual gradient coil are generally executed coaxially in order to shield against effects of the Lorentz forces.

As an interface a plate is provided that is attached to the vibrating magnet housing. The attachment ensues with bolt connections, for example.

The gradient current feed lines are connected with one another on the plate, typically using cable lugs.

The gradient coil transmits vibrations to the coaxial lines. The transferred vibrations can lead to movements of the coaxial cables that are directed in the direction opposite the movements of the magnet housing.

A relative movement that results between the magnet housing and the coaxial cables due to the vibrations, leads to additional flexing of the coaxial cables, to friction and to mechanical oscillations such that a material fatigue or even line breaks are not to be ruled out.

SUMMARY OF THE INVENTION

An object of the present invention is to provide an improved and mechanically reliable arrangement of gradient current feed lines that simultaneously enables an improved image quality.

This object is achieved by an arrangement according to the invention for connection of gradient current feed lines in a magnetic resonance apparatus, having an electrically insulating connection plate. This in turn has at least one connection device that is fashioned to electrically connect a first gradient current feed line with a second gradient current feed line. The connection device is associated with a gradient coil that forms a gradient field via a supplied gradient current for a spatial direction. The supply ensues via the two gradient current feed lines connected with one another. A base plate is fashioned for fastening the connection plate to a magnet housing of the magnetic resonance apparatus.

According to the invention, an electrically insulating layer that is fashioned to damp vibrations of the connection plate is arranged between the base plate and the connection plate.

This insulating layer is produced from a soft plastic.

A cellular polyetherurethane elastomer (also designated as a "PUR elastomer") is also preferably used as an insulating layer.

The PUR elastomer preferably possesses a static modulus of elasticity and a dynamic modulus of elasticity that are essentially the same in the framework of the technical application.

The modulus of elasticity (also: tensile modulus, coefficient of elasticity or Young's modulus) is a material parameter from material engineering that describes the correlation between stress and expansion given the deformation of a solid body with linear elastic behavior. The modulus of elasticity is abbreviated as E-modulus or as a symbol with E and has the unit of mechanical tension as a unit.

The magnitude of the modulus of elasticity is greater the more resistance with which a material opposes its deformation. A module made from a material with high modulus of elasticity (for example steel) is thus rigid while a module made from a material with low modulus of elasticity (for example rubber) is pliable. The modulus of elasticity is the proportionality constant in Hooke's law.

The PUR elastomer possesses a slight tendency to creep given static and dynamic loading, such that it can be used as a relatively dimensionally stable intermediate layer.

The PUR elastomer has a preferred density range from 300 $kg/m^3$ to 1,000 $kg/m^3$.

In testing, material known as "Sylodyn®" has proven to be a preferred PUR elastomer. Properties of this traded plastic are published on the Internet by RRG Industrietechnik GmbH, D-45470 Mühlheim an der Ruhr, for example.

Due to the arrangement according to the invention, the connection plate is connected with the base plate via the insulating layer such that it is essentially "floating". A decoupling of the connected gradient current feed lines or of the connection plate relative to all possible relative movements that the magnet housing could execute ensues via the insulating layer.

The relative movements—and therefore alternating stresses—of the individual components are decidedly minimized via the arrangement according to the invention. The lifespan is therefore increased and the service costs are reduced.

DESCRIPTION OF THE PREFERRED EMBODIMENTS

Figure 1:
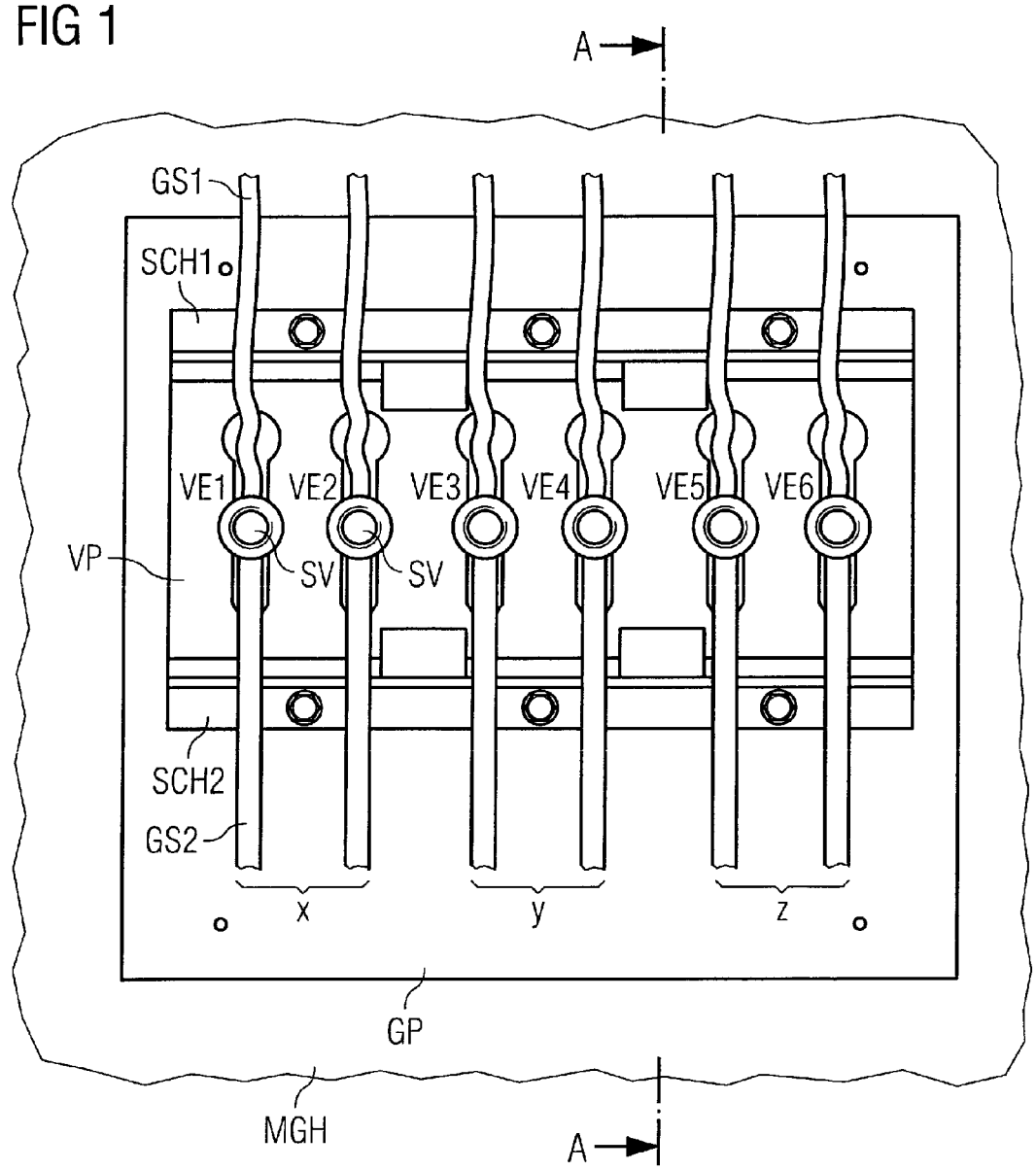
FIG. 1 is a front view of the arrangement according to the invention.

FIG. 1 shows a front view of the arrangement according to the invention.

An electrically insulating connection plate VP here possesses in total six connection devices VE1 through VE6.

Gradient currents are thereby directed via a first connection device VE1 and via a second connection device VE2 of an X-gradient coil (not shown here) so that the X-gradient coil exemplarily forms a gradient field in the X-spatial direction.

The same correspondingly applies for the connection devices VE3 through E6, which are respectively associated in pairs with gradient coils for the Y-spatial direction or for the Z-spatial direction.

The first connection device VE1 is described in the following to be representative of the connection devices VE1 through VE6.

The first connection device VE1 is fashioned for the electrical connection of a first gradient current feed line GS1 with a second gradient current feed line GS2.

Here both gradient current feed lines GS1, GS2 are exemplarily connected with one another using a bolt connection SV.

The first connection device VE1 is associated with the gradient coil (not shown here) that forms a gradient coil via the supplied gradient current for the X-spatial direction. The feed ensues via the gradient current feed lines GS1, GS2 connected with one another.

A base plate GP is fashioned for the attachment of the connection plate VP to a magnet housing MGH of the magnetic resonance apparatus and for this purpose possesses (for example) two rails SCH1, SCH2.

The two rails SCH1, SCH2 encompass the connection plate VP at least partially in order to hold it.

Figure 2:
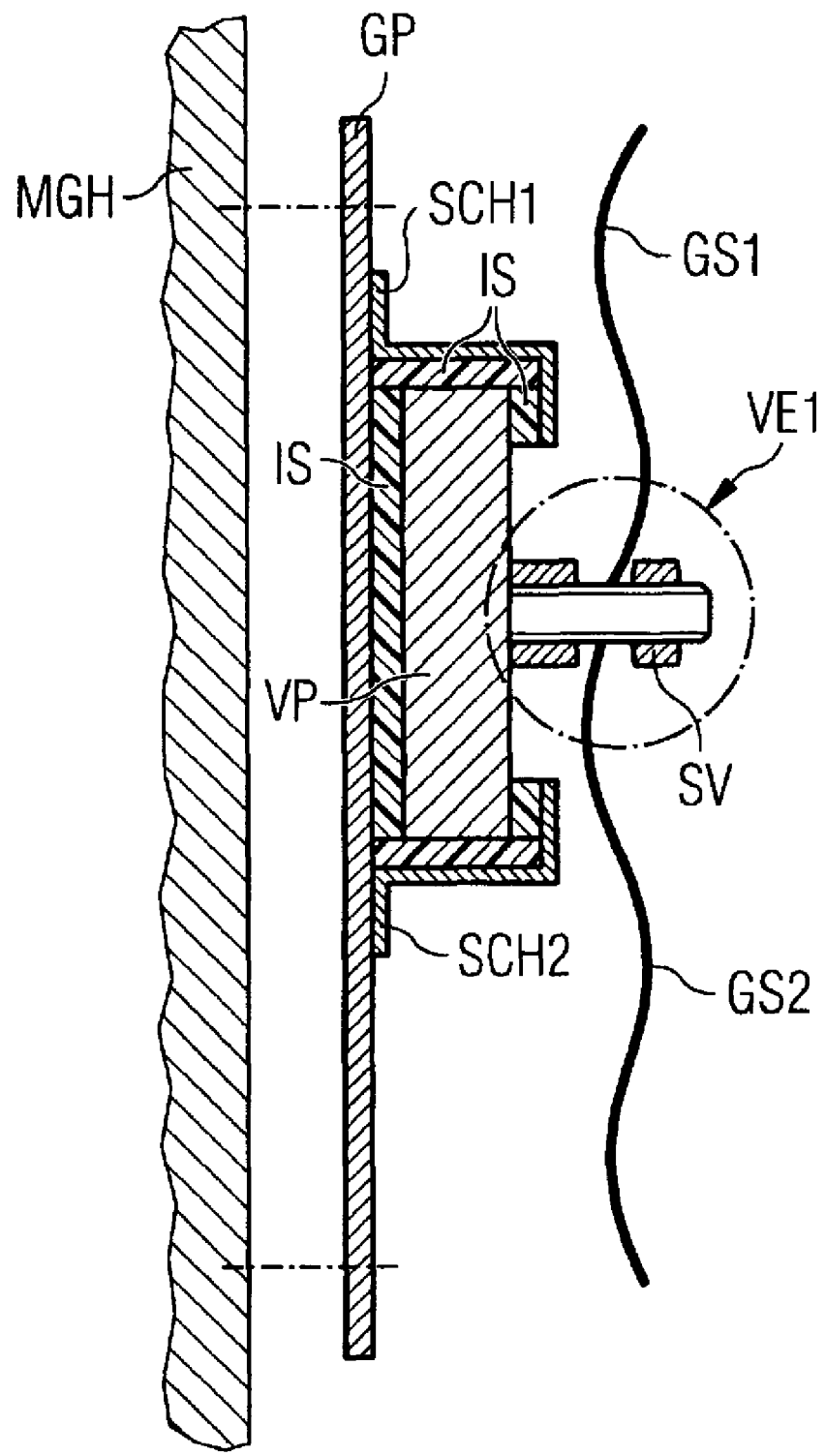
FIG. 2 is a side view of the arrangement according to the invention from FIG. 1, in a section presentation.

FIG. 2 shows a side view of the arrangement according to the invention from FIG. 1 in a section representation.

An insulating layer IS that serves to damp vibrations of the connection plate VP is arranged between the base plate PG on the one side and the connection plate VP on the other side.

The insulating layer IS is preferably produced from a PUR elastomer.

In a preferred embodiment, the individual connection devices are separated further and, if necessary, are respectively borne separately, individually and "floating".

In another embodiment, both the insulating connection plate VP and the insulating layer IS are produced as a single piece from the PUR elastomer or from rubber or a suitable vibration-damping plastic.

Although modifications and changes may be suggested by those skilled in the art, it is the intention of the inventors to embody within the patent warranted hereon all changes and modifications as reasonably and properly come within the scope of their contribution to the art.

We claim as our invention:

1. An arrangement for connection of gradient current feed lines in a magnetic resonance apparatus, comprising:
   an electrically insulating connection plate carrying at least one connection device;
   said connection device being configured to electrically connect a first gradient current feed line with a second gradient current feed line;
   a gradient coil of a magnetic resonance apparatus, said gradient coil being electrically connected to said connection device and being supplied with gradient current from the first and second gradient current feed lines connected by the connection device, said gradient coil, in response to being fed with said gradient current, generating a gradient magnetic field in a spatial direction in said magnetic resonance apparatus;
   a base plate configured to fasten the connection plate to a magnet housing of said magnetic resonance apparatus; and
   an electrically insulating layer that damps mechanical vibrations of the connection plate, disposed between said base plate and said connection plate.

2. An arrangement as claimed in claim 1 wherein said insulating layer is comprised of a vibration-damping plastic.

3. An arrangement as claimed in claim 1 wherein said insulating layer is comprised of a cellular polyurethane elastomer.

4. An arrangement as claimed in claim 3 wherein said polyurethane elastomer has a static modulus of elasticity and a dynamic modulus of elasticity that are substantially equal to each other.

5. An arrangement as claimed in claim 3 wherein said polyurethane elastomer exhibits substantially no creep upon static and dynamic loading thereof.

6. An arrangement as claimed in claim 3 wherein said polyurethane elastomer has a density in a range between 300 and 1000 kg/m$^3$.

7. An arrangement as claimed in claim 1 wherein said base plate is connected to said magnet housing by a bolt connection.

8. An arrangement as claimed in claim 1 wherein said base plate comprises attachment elements configured to interact with said connection plate to fasten said connection plate to said base plate, and wherein said insulating layer has a first side adjacent said connection plate and a second side adjacent said fastening elements.

* * * * *